United States Patent [19]
Ehnholm et al.

[11] Patent Number: 5,296,811
[45] Date of Patent: Mar. 22, 1994

[54] MAGNETIC RESONANCE IMAGING APPARATUS AND METHOD

[75] Inventors: Gösta J. Ehnholm, Helsinki; Ilmari Kinanen, Espoo; Raimo Sepponen, Helsinki, all of Finland

[73] Assignee: Instrumentarium Corp., Finland

[21] Appl. No.: 970,805

[22] Filed: Nov. 3, 1992

[30] Foreign Application Priority Data

Nov. 22, 1991 [FI] Finland ............................... 915520

[51] Int. Cl.$^5$ ............................................. G01V 3/00
[52] U.S. Cl. .................................... 324/319; 324/318
[58] Field of Search ............... 324/300, 307, 309, 318, 324/319, 320, 321

[56] References Cited

U.S. PATENT DOCUMENTS

| | | | |
|---|---|---|---|
| 4,374,360 | 2/1983 | Sepponen | 324/320 |
| 4,906,931 | 3/1990 | Sepponen | 324/309 |
| 5,072,732 | 12/1991 | Rapoport et al. | 324/321 |
| 5,129,267 | 7/1992 | Nicholls | 324/321 |
| 5,154,178 | 10/1992 | Shah | 324/318 |

Primary Examiner—Louis Arana
Attorney, Agent, or Firm—Andrus, Sceales, Starke & Sawall

[57] ABSTRACT

The invention relates to a novel magnetic resonance imaging apparatus. The nuclei, protons or the paramagnetic electrons of an imaged object are cyclically polarized during a period of about one second with a permanent magnet which is then quickly shifted away from the imaged object in a permanent magnet carrier tube, so that the field of the permanent magnet would not have an interfering effect on the immediately following signal-collection for MRI-imaging. The permanent magnet can be manipulated or shifted back and forth in the tube either magnetically, pneumatically, hydraulically or mechanically. The apparatus also includes another permanent magnet or a resistive magnet coil couple, which is located in the tube near the opposite end of the tube, and which generates a homogeneous magnetic field within the imaged area. The apparatus includes a gradient coil system for generating a time-dependent magnetic field gradient necessary for imaging, as well as a coil system for producing an electromagnetic radio-frequency excitation signal to be linked with the nuclei or paramagnetic electrons of an imaged object as well as for registering the response of the nuclei or electrons to said signal. A control unit is used to control the above coils and to receive the information therefrom for producing an image or some other representation thereof.

12 Claims, 2 Drawing Sheets

MAGNETIC RESONANCE IMAGING APPARATUS AND METHOD

BACKGROUND OF THE INVENTION

Magnetic resonance imaging or MRI is a fast-growing diagnostic modality. The method was discovered towards the end of the 1970's and it provides similar slice images as X-ray tomography, but with improved contrast and resolution. The annual demand on the market is currently in the order of 1000 apparatus units. The most significant drawback of the method is probably its high costs. The price of a single installation is typically up to 1.5-2 million dollars or more. The most important reason for this is that the available pieces of apparatus are designed as general imaging eguipment and are capable of producing images of the entire human body. Therefore, their most expensive component, a magnet, becomes large in size and high in price.

There would also be a lot of interest in the market towards cheaper equipment that could be special equipment for just imaging some certain member of the body, such as the ankle, knee, wrist, maxillary joint, thorax etc. Thus, in the MRI-field there is a definite demand for inventions relating to better and cheaper imaging magnet systems.

The current MRI equipment employs three types of magnets: superconducting, resistive and permanent magnets. The superconducting ones produce the best result: a field generated thereby is at the same time powerful ($<1.5$), stable and homogeneous in a large volume. However, this type of magnet is the most expensive one of them all. The permanent magnet is capable of producing a second strongest field ($<0.3-0.5T$) but these magnets are very heavy and relatively expensive as well. The resistive magnets are the cheapest ones but produce the lowest field ($<0.1-0.2\%$) and often spend quite a lot of electricity and cooling water.

In his invention U.S. Pat. No. 4,906,931 R. Sepponen describes a means for lowering the price of an imaging magnet without compromising the image quality. The imaging is effected by means of two fields: The first step is the alignment or polarization of image-signal emitting protons (or other nuclei) with a powerful field Bp. This is followed by quickly changing the field into another Bo for effecting the actual imaging. A benefit gained by this method is that the imaging field Bo can be maintained quite low, for example 0.02-0.04 T, without actually losing any of the signal. A low field can be generated at a low cost, e.g. by means of a resistive magnet and, at the same time, it can be made sufficiently homogeneous and stable.

On the other hand, the polarizing field Bp can also be produced at a low cost, as its homogeneity and stability need not be particularly good. The Bp-field must be switched off rather quickly, appr. 0.1 s, as demonstrated by Macovski (A. Macovski et al.: Department of Electrical Engineering, Stanford University, Stanford, USA). It can be generated by using a magnet winding other than that used for producing Bo, whereby the generation thereof will be inexpensive since the Bp-magnet need not have particularly good homogeneity and stability.

An apparatus of the invention and its operation are illustrated in more detail in the accompanying drawing, in which

BRIEF DESCRIPTION OF THE DRAWINGS

FIG. 1 shows an MRI-apparatus of the invention for obtaining a NMR image of a portion P of a patient. The MRI apparatus includes permanent magnet D movable in tube F, a resistive or permanent magnet A, a gradient coil system B, an RF-transceiver, including a coil system C. A coil system E produces a magnetic force for shifting permanent magnet D in tube F. Control unit G controls the apparatus.

FIG. 2 shows an annular permanent magnet D having a mean diameter (D), width (b), and coil thickness (a). The distance (r) comprises the distance between the object to be imaged and magnet D. Angle ($a$) is formed between the end of distance (r) and the center line of the annular magnet coil.

FIG. 3 shows a shifting mechanism for moving annular permanent magnet D in tube F from one end to the other by the application of pneumatic or hydraulic fluid pressure PA through valve Y, operated by control unit G.

FIG. 4 illustrates a mechanical shifting mechanism for moving magnet D in tube F from one end to the other through the action of electric motor M which powers flywheel V and crankshaft K, responsive to control unit G.

DETAILED DESCRIPTION OF THE INVENTION

In terms of power consumption it would be et more economical to generate field Bp by using a permanent magnet which does not consume power at all. This is possible by means of our new invention.

Figure 1:
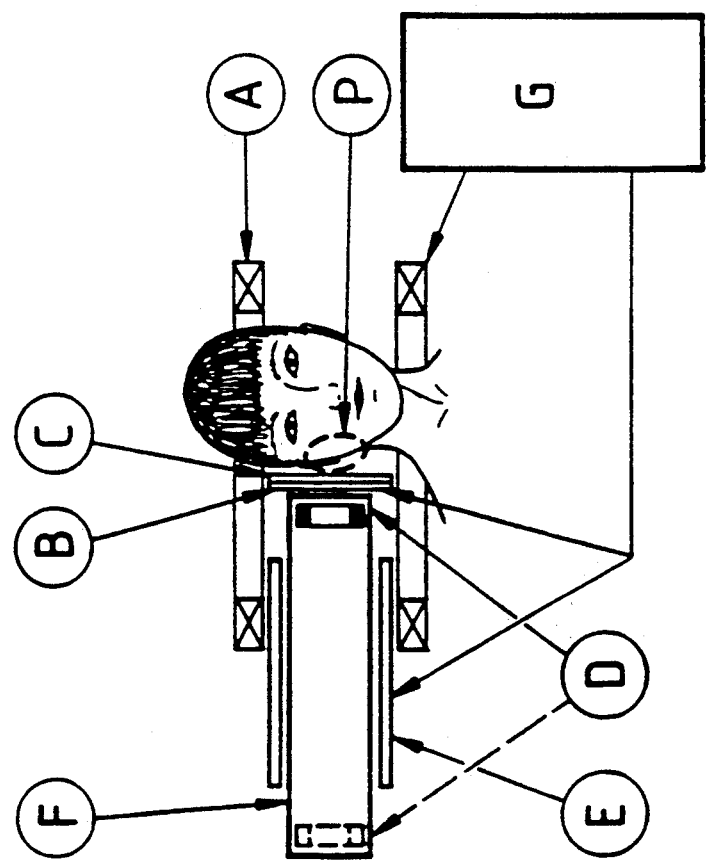
FIG. 1 shows an MRI-apparatus of the invention.

One embodiment of the invention is shown in FIG. 1. An apparatus as shown in the figure is applicable to the image of small objects, especially maxillary-joint imaging. A resistive magnet A, which can be for example a coil couple, such as the Helmholtz couple, or a permanent magnet, is used to generate a vertical homogeneous field Bo in the imaged area, P defined by the dash line. The magnet is supplied from a steady-current source, included in an electronics control unit G. A gradient coil system B is used in a conventional manner to produce the time-dependent gradients required for imaging. The gradient coil system is supplied from three computer-controlled current sources (included in G).

The proton resonance is excited and registered with a coil system C, which is connected to an Rf-transceiver and this further to a computer which controls imaging (G). These are all components and functions known in current equipment.

Figure 4:
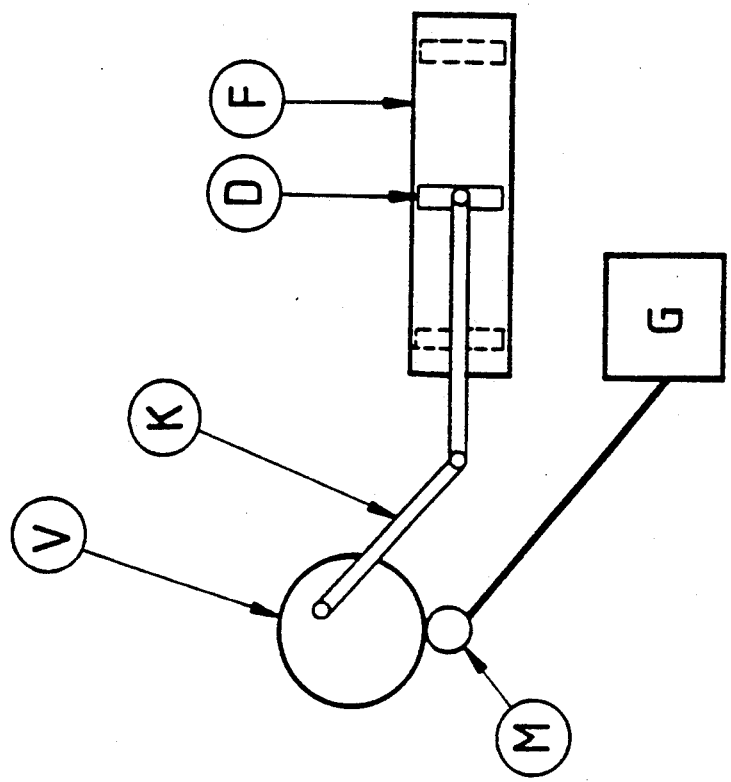
FIG. 4 illustrates a mechanical shifting mechanism for the magnet shown in FIG. 2.
Figure 3:
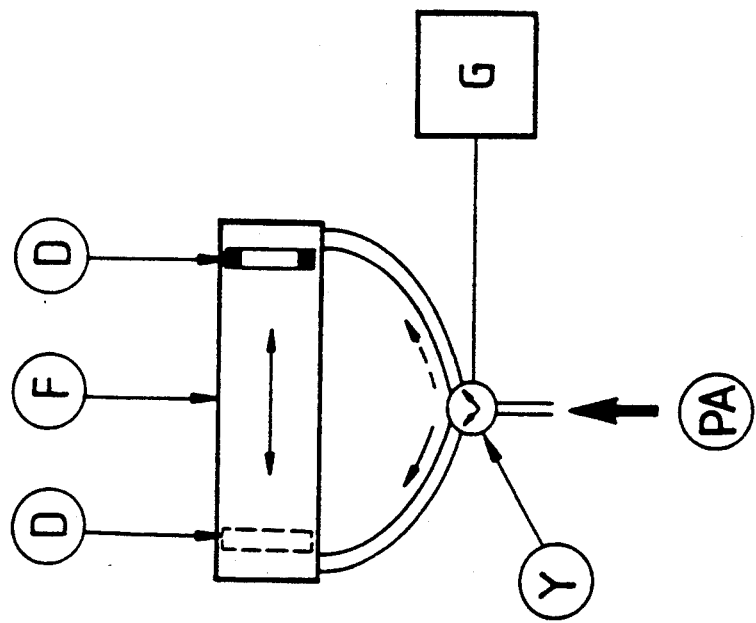
FIG. 3 shows a shifting mechanism for the magnet shown in FIG. 2.

In order to produce more signal, the apparatus is provided with the following components and functions, which make up a novel invention, namely a Polarizing Permanent magnet D as well as means for carrying it close to and far from the imaged area. In this case, the carrier means comprise a pneumatic FIG. 3) or mechanical (FIG. 4) system or preferably a coil system E (FIG. 1), controlled by a computer through the intermediary of a controllable current source in a manner that said coil system produces a magnetic force in the magnet D (as in a linear motor). The magnet can travel back and forth in tube F. The other extreme magnet position is indicated in FIG. 1 by a dash line. This particular motion can be produced in some other way as well, e.g. pneumatically (FIG. 3) or mechanically (FIG. 4).

An apparatus of the invention operates as follows: Coil E is used for moving magnet D at the start of an imaging session to the proximity of an imaged object for about a second for polarizing the protons in the imaged object. This is followed by moving the permanent magnet quickly away, in about one tenth of a second, whereafter the imaged area is quickly turned into an MRI-image in a prior known fashion by using the field of magnet A, which can be a solenoid or permanent magnet, as the Bo-field. Alternatively, it is possible to collect just some of the image information and to repeat the reciprocating motion of a polarization magnet for a few times and, after each motion, to collect image information until it is sufficient for the reconstruction of an entire image.

Next we shall demonstrate how the invention operates and that it is indeed beneficial.

In view of operation, it is essential that the polarization magnet can be shifted at a necessary speed and that it does not interfere with the collection of image data. As for utility, it is essential that the polarization field has a sufficient strength, i.e. <0.1 T, which reading is relatively easy to establish as a continuous field.

First we evaluate a field produced by means of a Polarization magnet. Our selected magnet material is NdFeB, the amount of which is e.g. 2 kg or 270 cm$^3$. If the magnet were spherical in shape, its radius would be 4 cm. If it is horizontally magnetized, it produces on the extension of a horizontal radius a parallel field $$B = JV/(2\pi r^3)$$

at a distance r from its centre. Here J is a material constant and equal to 1.2T, V is the volume of this particular sphere. If B is in teslas and r in centimeters, a formula can be written for the selected amount of material $$B = 0.8 \, (4/r)^3$$

Figure 2:
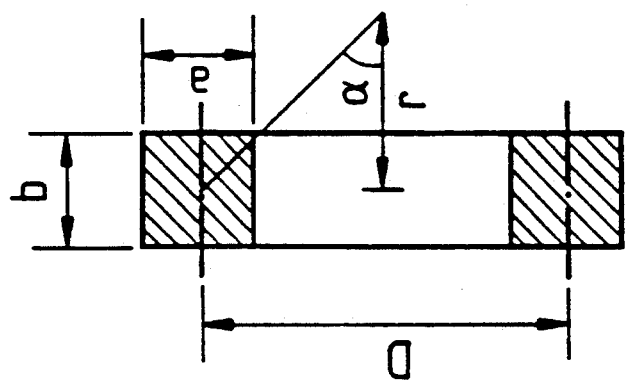
FIG. 2 shows an annular permanent magnet employed in the MRI-apparatus of the invention.

The formula applies very accurately indeed when the magnet is far away from an imaged object regardless of the shape of a magnet as long as the amount of material is the same. On the other hand, when being near the magnet, its precise shape must be taken into consideration. FIG. 2 shows one practical shape, namely an annular magnet having a mean diameter of (D)$\approx$8 cm. Thus, at a distance of r=4 cm, which is roughly the distance of an imaged object, the field has become smaller for two reasons:

First of all, the distance to an imaged object has increased by a factor of 1/cos$\alpha$. A result of this is that the field diminishes by a factor of (cos$\alpha$)$^3$. Secondly, only the horizontal field component is active, i.e. this yet produces a decaying factor of (cos$\alpha$). All in all, the common factor here is (cos$\alpha$)=$\frac{1}{4}$. Thus, at this Particular Point, the field strength is reduced from 0.8 Tesla and is $$B = 0.8/4 = 0.2 \, T$$

Thus, desired field strengths can be produced near an imaged object. The selected magnet geometry is preferred since the field strength in an imaged object does not change very rapidly as a function of distance r.

Next, we shall study the effect of a polarization magnet on the imaging volume at the time of collecting image data, i.e. when the magnet has been withdrawn. In this case, the interfering field component is parallel to Bo, i.e. vertical If moving away from the axis of a polarization magnet to a distance of $\Delta Z$, the effect on Bo is by $$\Delta B_o = \frac{2\Delta Z}{3 r_e} \, JV/(2\pi r_e^2)$$

Thus, it produces a gradient whose magnitude in our case is $$\frac{\Delta B_o}{\Delta Z} = \frac{2 \cdot 0.8}{3 r_e} \left(\frac{4}{r_e}\right)^3 \, [T/cm]$$

If selected $r_e = 50$ cm, the result is $$\frac{\Delta B_o}{\Delta Z} = 5.5 \times 10^{-6} \, T/cm$$

Typical imaging gradients are $10^{-4}$–$10^{-5}$ T/cm, so this gradient can be readily compensated by means of an imaging gradient coil system. The effect of higher-degree field gradients is negligible.

Finally, we evaluate a necessary force for moving the magnet in 0.1 seconds over 50 cm. According to our assumption, it is first accelerated by a constant force for 0.05 s and then decelerated by an equal reverse force.

The necessary speed after 0.05 s is two times 25 cm divided by 0.05 seconds, i.e. 10 m/s. The necessary acceleration is 10 m/s /0.05 s=200 m/s$^2$. The necessary force for a 2 kg mass is 400N, which is quite reasonable. In practice, it is preferable to increase the force gently, whereby its maximum value increases to some extent, but this does not cause trouble. If necessary, the coil system c can be movable in horizontal level and loaded e.g. with a 20 kg mass. Thus, said 400N force will be applied to the 20 kg mass for moving the coil a few centimeters back and forth during the movement of a polarization magnet, and the rest of the apparatus is not subjected to any forces.

The power required for the movement of a polarization magnet, provided that the movement commences once a second and the energy needed for stopping is wasted, will be equal to 400N$\times$0.25 m /1s=100W, which is low. An electromagnet producing a corresponding field requires about five times as much power, resulting in a cooling problem. In addition, no interfering eddy currents will be induced in a movable magnet of the invention during the course of imaging.

The invention can be further improved by assigning to a coil element E another function in addition to shifting a magnet. At the Polarization stage, a field Bp applied to an imaged object can be increased even further by maintaining the current on in said coil element which can be readily constructed to be capable of both shifting a magnet and of contributing to the polarization field. The polarization stage is thus terminated by momentarily reversing the current in coil element E, or in a section thereof if it consists of several windings.

We claim:

1. A magnetic resonance imaging apparatus that produces images of small objects, comprising:
   a permanent magnet, physically displaced from said object, said object having nuclei, protons, and paramagnetic electrons;
   means for cyclically polarizing said nuclei, said protons, or said electrons using said permanent magnet to thereby create a polarization field, said magnet being disposed near and end of said field; and
   means for shifting said permanent magnet, after said object has been polarized, to a distance from said polarized object such that said permanent magnet has no substantial effect on subsequent signal collection carried out for MRI-imaging.

2. The magnetic resonance imaging apparatus of claim 1, wherein said shifting means includes:
   coil means for emitting a magnetic pulse that causes said permanent magnet to shift; and
   control means for controlling said coil means.

3. The magnetic resonance imaging apparatus of claim 1, wherein said shifting means includes:
   pressurized fluid means, including pressurized fluid, for shifting said permanent magnet;
   valve means for controlling the flow of pressurized fluid within said pressurized fluid means; and
   control means for controlling said valve means.

4. The magnetic resonance imaging apparatus of claim 1, wherein said shifting means further comprises:
   an electric motor;
   a flywheel;
   a crankshaft interconnected with said electric motor; and
   control means for controlling said motor.

5. The magnetic resonance imaging apparatus of claim 1, wherein said shifting means includes:
   a permanent magnet carrying tube adapted to enable said permanent magnet to be freely reciprocable therein towards or away from said object.

6. The magnetic resonance imaging apparatus of claim 5, wherein said shifting means further comprises:
   coil means for emitting a magnetic pulse that causes said permanent magnet to reciprocate within said tube; and
   control means for controlling said coil means.

7. The magnetic resonance imaging apparatus of claim 5, wherein said shifting means further comprises:
   pressurized fluid means, including pressurized fluid, for reciprocating said permanent magnet within said tube;
   valve means for controlling the flow of pressurized fluid within said pressurized fluid means; and
   control means for controlling said valve means.

8. The magnetic resonance imaging apparatus of claim 5 wherein said shifting means further comprises:
   an electric motor;
   a flywheel;
   a crankshaft interconnected with said electric motor; and
   control means for controlling said motor.

9. The magnetic resonance imaging apparatus of claim 5 further comprising:
   a magnet means, disposed adjacent an end of said tube, for generating a homogeneous magnetic field, said magnet means including a Helmholtz coil couple;
   gradient coil means for generating a time-dependent magnetic field gradient;
   signal producing coil means for producing an electromagnetic radio-frequency excitation signal that is linked with said nuclei or with said paramagnetic electrons; and
   control means for both controlling and for receiving imaging information from said magnet means, said gradient coil means, and said signal producing coil means.

10. The magnetic resonance imaging apparatus of claim 1, further comprising:
    a magnet means for generating a homogeneous magnetic field, said magnet means including a Helmholtz coil couple;
    gradient coil means for generating a time-dependent magnetic field gradient;
    signal producing coil means for producing an electromagnetic radio-frequency excitation signal that is linked with said nuclei or with said paramagnetic electrons; and
    control means for both controlling and for receiving imaging information from said magnet means, said gradient coil means, and said signal producing coil means.

11. A method of imaging objects with a magnetic resonance imaging apparatus, comprising:
    polarizing said object using a permanent magnet by placing said magnet in proximity to said object for approximately one second;
    quickly moving said permanent magnet away from said object;
    producing an MRI-image of at least a portion of said object using either the field of said permanent magnet or the field of a resistive magnet as a Bio-field;
    producing a time-dependent magnetic gradient field from a gradient coil system;
    producing Rf-signals and receiver signals using a signal producing coil system; and
    transmitting said produced Rf-signals and receiver signals to a controller which forms the MRI-image.

12. The method of claim 11, further comprising:
    using a pulse-emitting coil to move said permanent magnet; and
    increasing the polarization of said object using said pulse-emitting coil.

* * * * *